United States Patent
Muddu et al.

(10) Patent No.: US 6,389,581 B1
(45) Date of Patent: May 14, 2002

(54) OPTIMIZING REPEATERS POSITIONING ALONG INTERCONNECTS

(75) Inventors: Sudhakar Muddu, Santa Clara; Egino Sarto, Palo Alto, both of CA (US)

(73) Assignee: Silicone Graphics Inc., Mountain View, CA (US)

( * ) Notice: Subject to any disclaimer, the term of this patent is extended or adjusted under 35 U.S.C. 154(b) by 0 days.

(21) Appl. No.: 09/388,938

(22) Filed: Sep. 2, 1999

Related U.S. Application Data (60) Provisional application No. 60/144,386, filed on Jul. 16, 1999.

(51) Int. Cl.⁷ .............................................. G06F 17/50

(52) U.S. Cl. ................................ 716/6; 716/10; 716/12

(58) Field of Search ........................................ 716/1–21

(56) References Cited

U.S. PATENT DOCUMENTS

| | | | | |
|---|---|---|---|---|
| 5,212,107 A | * | 5/1993 | Suzuki et al. ............... | 438/599 |
| 5,285,165 A | | 2/1994 | Renfors et al. ............. | 328/167 |
| 5,519,351 A | * | 5/1996 | Matsumoto ................. | 327/295 |
| 5,557,779 A | * | 9/1996 | Minami ......................... | 716/6 |
| 5,798,935 A | * | 8/1998 | Doreswamy et al. .......... | 716/6 |
| 5,926,397 A | * | 7/1999 | Yamanouchi ................ | 716/14 |
| 5,974,245 A | * | 10/1999 | Li et al. ....................... | 716/10 |
| 6,009,248 A | * | 12/1999 | Sato et al. ..................... | 716/2 |
| 6,117,182 A | * | 9/2000 | Alpert et al. .................. | 716/8 |
| 6,198,978 B1 | * | 3/2001 | Takahashi .................... | 700/97 |
| 6,205,570 B1 | * | 3/2001 | Yamashita .................... | 716/1 |

OTHER PUBLICATIONS

Chen et al. ("An algorithm for zero–skew clock tree routing with buffer insertion", Proceedings of European Design and Test Conference, Mar. 11, 1996, pp. 230–236).*

Tellez et al. ("Minimal buffer insertion in clock trees with skew and slew rate constraint", IEEE Transactions on Computer–Aided Design of Integrated Circuits and Systems, vol. 16, No. 4, Apr. 1997, pp. 333–342).*

Adler et al. ("Repeater design to reduce delay and power in resistive interconnect", IEEE Transactions on Circuits and Systems II: Analog and Digital Signal Processing, vol. 45, No. 5, May 1998, pp. 607–616),*

Chung et al. ("Optimal buffered clock tree synthesis", Proceedings of the Seventh Annual International ASIC Conference and Exhibit, Sep. 19, 1994, pp. 130–133).*

(List continued on next page.)

*Primary Examiner*—Matthew Smith
*Assistant Examiner*—Phallaka Kik
(74) *Attorney, Agent, or Firm*—Squire, Sanders & Dempsey L.L.P.

(57) ABSTRACT

An aspect of interconnect design for optimizing delay characteristics of interconnects. The interconnect design for delay characteristics optimization is performed using a method for optimizing repeaters positioning along interconnects. The method includes inserting repeaters in positions along a first interconnect at predetermined intervals that are related to signals transition time. The method further includes inserting repeaters in positions along a second interconnect at the predetermined intervals, the second interconnect being a neighbor of the first interconnect. The positions of repeaters along the second interconnect are offset, by a predetermined length, relative to the positions of repeaters along the first interconnect so that the repeaters positions along the second interconnect are shifted relative to the repeaters positions along the first interconnect. In one embodiment, the predetermined length is half (0.5) of the predetermined interval such that repeaters are shifted by half, wherein the interconnect delay that corresponds to the offsetting by half of the predetermined interval minimizes the interconnect delay under worst case conditions. The repeaters are inserted to decrease interconnect delay and make the interconnect delay scale linearly with an interconnect length.

2 Claims, 6 Drawing Sheets

| Input waveforms (Left neighbor, victim, right neighbor | Interconnect Delay (ns) | | | | | |
|---|---|---|---|---|---|---|
| | Left, right neighbor buffer phases: 0,0 | | | Left, right neighbor buffer phases: 0.5,0.5 | | |
| | Left neighbor Delay | Victim Delay | Right neighbor Delay | Left neighbor Delay | Victim Delay | Right neighbor Delay |
| R, R, R | 0.361 | 0.361 | 0.361 | 0.510 | 0.630 | 0.510 |
| R, R, F | 0.428 | 0.584 | 0.676 | 0.533 | 0.697 | 0.499 |
| R, F, R | 0.546 | 0.994 | 0.546 | 0.483 | 0.689 | 0.483 |
| R, F, F | 0.676 | 0.584 | 0.428 | 0.499 | 0.697 | 0.533 |
| F, R, R | 0.676 | 0.584 | 0.428 | 0.499 | 0.697 | 0.533 |
| F, R, F | 0.546 | 0.994 | 0.546 | 0.483 | 0.689 | 0.483 |
| F, F, R | 0.428 | 0.584 | 0.676 | 0.533 | 0.697 | 0.499 |
| F, F, F | 0.361 | 0.361 | 0.361 | 0.510 | 0.630 | 0.510 |

OTHER PUBLICATIONS

Muddu et al. ("Repeater and interconnect strategies for high–performance physical designs", Proceedings of XI Brazilian Sympsoium on Integrated Circuit Design, Sep. 30, 1998, pp. 226–231).*

Semiconductor Industry Association, National Technology Roadmap for Semiconductors, pages Table of Contents, pp. 1–3, 7–19, 23–113, 163–178, Appendix B1–C8, 1994.

Personal communication, SIA NTRS 1997 Revision, Design and Test Technology Working Group (chairs: R. Howard, P. Verhofstadt), 1997 Table of Contents, pp. 1–3, 8, 10–17, 25–38, 94–109, Appendix B, C and D, 1997.

C. J. Alpert and A. Devgan, "Wire Segmenting for Improved Buffer Insertion", Proc. Design Automation Conf., pp. 558–593, Jun. 1997.

D. P. LaPotin, U. Ghoshal, E. Chiprout, S. R. Nassif, "Physical Design Challenges For Performance", International Symposium on Physical Design, pp. 225–226, Apr. 1997.

L. Scheffer, "A Roadmap Of CAD Tool Changes For Sub–Micron Interconnect Problems", International Symposium on Physical Design, pp. 104–109, Apr. 1997.

R. F. Sechler, "Interconnect design with VLSI CMOS", IBM Journal of Research and Development, pp. 23–31, Jan.–Mar. 1995.

J. Cong, L. He, A.B. Kahng, D. Noice, N. Shirali and S. H.–C. Yen, Analysis And Justification Of A Simple, Practical 2 ½–D Capacitance Extraction Methodology, Proc. Design Automation Conference, pp. 627–632, Jun. 1997.

L. Gwennap, "IC Vendors Prepare for 0.25–Micron Leap", Microprocessor Report, pp. 11–15, Sep. 16, 1996.

A. B. Kahng and S. Muddu, "Efficient Gate Delay Modeling For Large Interconnect Loads", Proc. IEEE Multi–Chip Module Conference, 6 pages, Feb. 1996.

S.Y. Oh, K.–J. Chang, N. Chang and K. Lee, "Interconnect Modeling And Design In High–Speed VLSI–ULSI Systems", Proc. International Conference on Computer Design: VLSI in Computers and Processors, pp. 184–189, Oct. 1992.

W.C. Elmore, "The Transient Response Of Damped Linear Networks with Particular Regard To Wideband Amplifiers," Journal of Applied Physics, vol. 19, Jan.–Dec. 1948, pp. 55–63.

A.B. Kahng and S. Muddu, "An Analytical Delay Model For RLC Interconnects," IEEE 1996, pp. 237–240.

A.B. Kahng, K. Masuko and S. Muddu, "Analytical Delay Models For VLSI Interconnects Under Ramp Input", IEEE/ACM International Conference on CAD, Nov. 1996, 7 pages.

A.B. Kahng and S. Muddu, "A Glossary On Analysis And Modeling Of VLSI Interconnections,"marked Confidential, including Contents, Feb. 1996, 3 pages.

S.P McCormick, "Modeling and Simulation of VLSI Interconnections with Moments," RLE Technical Report No. 543, PhD Thesis, MIT, May 1989.

J.K. Ousterhout, "A Switch–Level Timing Verifier For Digital MOS VLSI," IEEE Transactions on Computer–Aided Design, vol. CAD–4, No. 3, Jul. 1985, pp. 336–349.

P.R. O'Brien and T.L. Savarino, "Modeling the Driving–Point Characteristic Of Resistive Interconnect For Accurate Delay Estimation," Proc. IEEE, 1989, pp. 512–515.

P.R. O'Brien and T.L. Savarino, "Efficient On–Chip Delay Estimation For Leaky Models Of Multiple–Source Nets," Proc. IEEE 1990, Custom Integrated Circuits Conference, pp. 9.6.1–9.6.4.

L.T. Pillage, "Asymptotic Waveform Evaluation For Timing Analysis," IEEE Transactions on Computer–Aided Design, vol. 9, No. 4, Apr. 1990, pp. 352–366.

J. Qian, S. Pullela and L. Pillage, "Modeling The Effective Capacitance For The RC Interconnect Of CMOS Gates," IEEE Transactions on Computer–Aided Design of Integrated Circuits and Systems, vol. 13, No. 12, Dec. 1994, pp. 1526–1535.

J. Rubinstein, P. Penfield, Jr. And M.A. Horowitz, "Signal Delay In RC Tree Networks," IEEE Transactions on Computer–Aided Design, vol. CAD–2, No. 3, Jul. 1983, pp. 202–211.

C.L. Ratzlaff, S. Pullela and L. T. Pillage, "Modeling The RC–Interconnect Effects In A Hierarchical Timing Analyzer," IEEE Custom Integrated Circuits Conference, May 1992, pp. 15.6.1–15.6.4.

Synopsys, "Design Compiler Family Reference Manual," Version 3.3a, Mar. 1995, pp. 8–1–8–5.

H.B. Bakoflu, "Circuits, Interconnections, and Packaging for VLSI," Addison–Wesley Publishing Company, 1990, pp. 202–207, 212–215, 282–285.

A. Devgan, "Efficient Coupled Noise Estimation for On–Chip Interconnects," IEEE International Conference on Computer–Aided Design, Nov. 1997, pp. 147–151.

G.A. Katopis and H.H. Smith, "Coupled Noise Predictors for Lossy Interconnects," IEEE Transactions on Components, Packaging, and Manufacturing Technology–Part B. vol. 17, No. 4, Nov. 1994, pp. 520–524.

H. Kawaguchi and T. Sakurai, "Delay and Noise Formulas for Capacitively Coupled Distributed RC Lines," Proc. Asian and South Pacific Design Automation Conference, 1998, pp. 35–43.

K. Rahmat, O.S. Nakagawa, S–Y. Oh and J. Moll, "A Scaling Scheme for Interconnect in Deep–Submicron Processes," IEEE International Electronic Devices Meeting, 1995, pp. 10.2.1–10.2.4.

K.L. Shepard, S.M. Carey, E.K. Cho, B.W. Curran, R.F. Hatch, D.E. Hoffman, S.A. McCabe, G.A. Northrop, R. Seigler, "Design Methodology for the S/390 Parallel Enterprise Server G4 Microprocessors," IBM Journal of Research and Development, vol. 41, No. 4/5, Jul/Sep. 1997, pp. 515–547.

A. Vittal and M. Marek–Sadowsak, "Crosstalk Reduction for VLSI," IEEE Transactions on Computer–Aided Design of Integrated Circuits and Systems, vol. 16, No. 3, Mar. 1997, pp. 290–298.

G. Yee, R. Chandra, V. Ganesan and C. Sechen, "Wire Delay In the Presence of Crosstalk," ACM/IEEE International Workshop on Timing Issues in the Specification and Synthesis of Digital Systems, Dec. 97, pp. 170–175.

K.L. Shepard and V. Narayanan, "Conquering Noise in Deep–Submicron Digital Ics," IEEE Design & Test of Computers, Jan.–Mar. 1998, pp. 51–62.

K. Rahmat, J. Neves and J.F. Lee, "Methods for calculating coupling noise in early design: a comparative analysis," IEEE 1998, pp. 76–81.

R. Macys and S. McCormick, "A New Algorithm for Computing the Effective Capacitance in Deep Sub–micron Circuits," IEEE Custom Integrated Circuits Conference, 1998, pp. 313–316.

T. Sakurai, "Closed–Form Expressions for Interconnection Delay, Coupling, and Crosstalk in VLSI's", IEEE Transactions on Electron Devices, vol., 40, No. 1, pp. 118–124, Jan. 1993.

* cited by examiner

| Input waveforms (Left neighbor, victim, right neighbor) | Interconnect Delay (ns) | | | | | |
| --- | --- | --- | --- | --- | --- | --- |
| | Left, right neighbor buffer phases: 0,0 | | | Left, right neighbor buffer phases: 0.5,0.5 | | |
| | Left neighbor Delay | Victim Delay | Right neighbor Delay | Left neighbor Delay | Victim Delay | Right neighbor Delay |
| R, R, R | 0.361 | 0.361 | 0.361 | 0.510 | 0.630 | 0.510 |
| R, R, F | 0.428 | 0.584 | 0.676 | 0.533 | 0.697 | 0.499 |
| R, F, R | 0.546 | 0.994 | 0.546 | 0.483 | 0.689 | 0.483 |
| R, F, F | 0.676 | 0.584 | 0.428 | 0.499 | 0.697 | 0.533 |
| F, R, R | 0.676 | 0.584 | 0.428 | 0.499 | 0.697 | 0.533 |
| F, R, F | 0.546 | 0.994 | 0.546 | 0.483 | 0.689 | 0.483 |
| F, F, R | 0.428 | 0.584 | 0.676 | 0.533 | 0.697 | 0.499 |
| F, F, F | 0.361 | 0.361 | 0.361 | 0.510 | 0.630 | 0.510 |

Figure 2

| A. Line length 10000 μm, Technology I (M3) ||||||||||||
|---|---|---|---|---|---|---|---|---|---|---|---|
| | | Right Neighbor Phase |||||||||||
| | | 0 | 0.1 | 0.2 | 0.3 | 0.4 | 0.5 | 0.6 | 0.7 | 0.8 | 0.9 |
| Left Neighbor Phase | 0 | 0.994 | 0.988 | 0.971 | 0.954 | 0.929 | 0.910 | 0.874 | 0.900 | 0.930 | 0.962 |
| | 0.1 | 0.988 | 0.974 | 0.960 | 0.938 | 0.911 | 0.885 | 0.854 | 0.881 | 0.917 | 0.952 |
| | 0.2 | 0.971 | 0.960 | 0.941 | 0.917 | 0.887 | 0.848 | 0.829 | 0.863 | 0.897 | 0.932 |
| | 0.3 | 0.954 | 0.938 | 0.917 | 0.890 | 0.855 | 0.806 | 0.801 | 0.834 | 0.872 | 0.912 |
| | 0.4 | 0.929 | 0.911 | 0.887 | 0.855 | 0.818 | 0.753 | 0.766 | 0.805 | 0.841 | 0.885 |
| | 0.5 | 0.910 | 0.885 | 0.848 | 0.806 | 0.753 | 0.697 | 0.735 | 0.778 | 0.822 | 0.867 |
| | 0.6 | 0.874 | 0.854 | 0.829 | 0.801 | 0.766 | 0.735 | 0.739 | 0.768 | 0.799 | 0.832 |
| | 0.7 | 0.900 | 0.881 | 0.863 | 0.834 | 0.805 | 0.778 | 0.768 | 0.796 | 0.827 | 0.859 |
| | 0.8 | 0.930 | 0.917 | 0.897 | 0.872 | 0.841 | 0.822 | 0.799 | 0.827 | 0.860 | 0.894 |
| | 0.9 | 0.962 | 0.952 | 0.932 | 0.912 | 0.885 | 0.867 | 0.832 | 0.859 | 0.894 | 0.924 |

Figure 3a

| B. Line length 10000 μm, Technology II (M4) ||||||||||||
|---|---|---|---|---|---|---|---|---|---|---|---|
| | | Right Neighbor Phase |||||||||||
| | | 0 | 0.1 | 0.2 | 0.3 | 0.4 | 0.5 | 0.6 | 0.7 | 0.8 | 0.9 |
| Left Neighbor Phase | 0 | 1.437 | 1.422 | 1.400 | 1.370 | 1.332 | 1.299 | 1.259 | 1.300 | 1.343 | 1.388 |
| | 0.1 | 1.422 | 1.405 | 1.379 | 1.347 | 1.306 | 1.258 | 1.234 | 1.278 | 1.324 | 1.372 |
| | 0.2 | 1.400 | 1.379 | 1.352 | 1.315 | 1.270 | 1.206 | 1.199 | 1.247 | 1.296 | 1.347 |
| | 0.3 | 1.370 | 1.347 | 1.315 | 1.274 | 1.223 | 1.144 | 1.158 | 1.208 | 1.261 | 1.314 |
| | 0.4 | 1.332 | 1.306 | 1.270 | 1.223 | 1.167 | 1.075 | 1.109 | 1.161 | 1.216 | 1.273 |
| | 0.5 | 1.299 | 1.258 | 1.206 | 1.144 | 1.075 | 1.015 | 1.069 | 1.124 | 1.180 | 1.239 |
| | 0.6 | 1.259 | 1.234 | 1.199 | 1.158 | 1.109 | 1.069 | 1.079 | 1.120 | 1.163 | 1.209 |
| | 0.7 | 1.300 | 1.278 | 1.247 | 1.208 | 1.161 | 1.124 | 1.120 | 1.160 | 1.203 | 1.250 |
| | 0.8 | 1.343 | 1.324 | 1.296 | 1.261 | 1.216 | 1.180 | 1.163 | 1.203 | 1.246 | 1.293 |
| | 0.9 | 1.388 | 1.372 | 1.347 | 1.314 | 1.273 | 1.239 | 1.209 | 1.250 | 1.293 | 1.339 |

Figure 3b

| C. Line length 14000 μm, Technology I (M3) |||||||||||
|---|---|---|---|---|---|---|---|---|---|---|
| | | Right Neighbor Phase |||||||||
| | | 0 | 0.1 | 0.2 | 0.3 | 0.4 | 0.5 | 0.6 | 0.7 | 0.8 | 0.9 |
| Left Neighbor Phase | 0 | 1.474 | 1.467 | 1.448 | 1.429 | 1.401 | 1.383 | 1.341 | 1.340 | 1.382 | 1.427 |
| | 0.1 | 1.467 | 1.454 | 1.439 | 1.414 | 1.385 | 1.356 | 1.308 | 1.324 | 1.370 | 1.417 |
| | 0.2 | 1.448 | 1.439 | 1.418 | 1.393 | 1.359 | 1.320 | 1.267 | 1.299 | 1.345 | 1.395 |
| | 0.3 | 1.429 | 1.414 | 1.393 | 1.362 | 1.328 | 1.276 | 1.217 | 1.267 | 1.319 | 1.375 |
| | 0.4 | 1.401 | 1.385 | 1.359 | 1.328 | 1.287 | 1.223 | 1.174 | 1.229 | 1.285 | 1.342 |
| | 0.5 | 1.383 | 1.356 | 1.320 | 1.276 | 1.223 | 1.105 | 1.146 | 1.203 | 1.263 | 1.323 |
| | 0.6 | 1.341 | 1.308 | 1.267 | 1.217 | 1.174 | 1.146 | 1.110 | 1.162 | 1.220 | 1.281 |
| | 0.7 | 1.340 | 1.324 | 1.299 | 1.267 | 1.229 | 1.203 | 1.162 | 1.192 | 1.240 | 1.287 |
| | 0.8 | 1.382 | 1.370 | 1.345 | 1.319 | 1.285 | 1.263 | 1.220 | 1.240 | 1.283 | 1.330 |
| | 0.9 | 1.427 | 1.417 | 1.395 | 1.375 | 1.342 | 1.323 | 1.281 | 1.287 | 1.330 | 1.377 |

Figure 3c

| D. Line length 14000 μm, Technology II (M4) |||||||||||
|---|---|---|---|---|---|---|---|---|---|---|
| | | Right Neighbor Phase |||||||||
| | | 0 | 0.1 | 0.2 | 0.3 | 0.4 | 0.5 | 0.6 | 0.7 | 0.8 | 0.9 |
| Left Neighbor Phase | 0 | 2.123 | 2.108 | 2.085 | 2.052 | 2.011 | 1.983 | 1.925 | 1.938 | 1.995 | 2.056 |
| | 0.1 | 2.108 | 2.092 | 2.064 | 2.029 | 1.985 | 1.943 | 1.876 | 1.913 | 1.974 | 2.039 |
| | 0.2 | 2.085 | 2.064 | 2.036 | 1.996 | 1.947 | 1.889 | 1.816 | 1.878 | 1.944 | 2.012 |
| | 0.3 | 2.052 | 2.029 | 1.996 | 1.952 | 1.898 | 1.823 | 1.765 | 1.883 | 1.903 | 1.977 |
| | 0.4 | 2.011 | 1.985 | 1.947 | 1.898 | 1.837 | 1.743 | 1.703 | 1.778 | 1.854 | 1.932 |
| | 0.5 | 1.983 | 1.943 | 1.889 | 1.823 | 1.743 | 1.590 | 1.664 | 1.744 | 1.823 | 1.903 |
| | 0.6 | 1.925 | 1.876 | 1.816 | 1.765 | 1.703 | 1.664 | 1.630 | 1.686 | 1.763 | 1.843 |
| | 0.7 | 1.938 | 1.913 | 1.878 | 1.833 | 1.778 | 1.744 | 1.686 | 1.741 | 1.801 | 1.867 |
| | 0.8 | 1.995 | 1.974 | 1.944 | 1.903 | 1.854 | 1.823 | 1.763 | 1.801 | 1.860 | 1.925 |
| | 0.9 | 2.056 | 2.039 | 2.012 | 1.977 | 1.932 | 1.903 | 1.843 | 1.867 | 1.925 | 1.989 |

Figure 3d

| A. Line length 10000 μm, Technology I (M3) |||||||||||
|---|---|---|---|---|---|---|---|---|---|---|
| | | Right Neighbor Phase |||||||||
| | | 0 | 0.1 | 0.2 | 0.3 | 0.4 | 0.5 | 0.6 | 0.7 | 0.8 | 0.9 |
| Left Neighbor Phase | 0 | 1.090 | 1.071 | 1.051 | 1.021 | 0.988 | 0.942 | 0.948 | 0.984 | 1.018 | 1.051 |
| | 0.1 | 1.071 | 1.054 | 1.026 | 0.995 | 0.957 | 0.905 | 0.920 | 0.958 | 0.997 | 1.035 |
| | 0.2 | 1.051 | 1.026 | 0.998 | 0.964 | 0.921 | 0.865 | 0.890 | 0.930 | 0.970 | 1.008 |
| | 0.3 | 1.021 | 0.995 | 0.964 | 0.924 | 0.876 | 0.825 | 0.854 | 0.894 | 0.936 | 0.980 |
| | 0.4 | 0.988 | 0.957 | 0.921 | 0.876 | 0.825 | 0.782 | 0.813 | 0.856 | 0.900 | 0.944 |
| | 0.5 | 0.942 | 0.905 | 0.865 | 0.825 | 0.782 | 0.760 | 0.791 | 0.824 | 0.860 | 0.900 |
| | 0.6 | 0.948 | 0.920 | 0.890 | 0.854 | 0.813 | 0.791 | 0.816 | 0.849 | 0.879 | 0.911 |
| | 0.7 | 0.984 | 0.958 | 0.930 | 0.894 | 0.856 | 0.824 | 0.849 | 0.880 | 0.911 | 0.945 |
| | 0.8 | 1.018 | 0.997 | 0.970 | 0.936 | 0.900 | 0.860 | 0.879 | 0.911 | 0.944 | 0.982 |
| | 0.9 | 1.051 | 1.035 | 1.008 | 0.980 | 0.944 | 0.900 | 0.911 | 0.945 | 0.982 | 1.016 |

Figure 4a

| B. Line length 10000 μm, Technology II (M4) |||||||||||
|---|---|---|---|---|---|---|---|---|---|---|
| | | Right Neighbor Phase |||||||||
| | | 0 | 0.1 | 0.2 | 0.3 | 0.4 | 0.5 | 0.6 | 0.7 | 0.8 | 0.9 |
| Left Neighbor Phase | 0 | 1.526 | 1.502 | 1.471 | 1.430 | 1.382 | 1.335 | 1.329 | 1.379 | 1.427 | 1.476 |
| | 0.1 | 1.502 | 1.475 | 1.440 | 1.396 | 1.343 | 1.284 | 1.292 | 1.345 | 1.398 | 1.449 |
| | 0.2 | 1.471 | 1.440 | 1.400 | 1.350 | 1.291 | 1.229 | 1.249 | 1.305 | 1.361 | 1.416 |
| | 0.3 | 1.430 | 1.396 | 1.350 | 1.295 | 1.231 | 1.171 | 1.200 | 1.258 | 1.315 | 1.373 |
| | 0.4 | 1.382 | 1.343 | 1.291 | 1.231 | 1.167 | 1.114 | 1.148 | 1.205 | 1.262 | 1.321 |
| | 0.5 | 1.335 | 1.284 | 1.229 | 1.171 | 1.114 | 1.074 | 1.124 | 1.175 | 1.226 | 1.279 |
| | 0.6 | 1.329 | 1.292 | 1.249 | 1.200 | 1.148 | 1.124 | 1.148 | 1.190 | 1.234 | 1.281 |
| | 0.7 | 1.379 | 1.345 | 1.305 | 1.258 | 1.205 | 1.175 | 1.190 | 1.234 | 1.280 | 1.328 |
| | 0.8 | 1.427 | 1.398 | 1.361 | 1.315 | 1.262 | 1.226 | 1.234 | 1.280 | 1.327 | 1.376 |
| | 0.9 | 1.476 | 1.449 | 1.416 | 1.373 | 1.321 | 1.279 | 1.281 | 1.328 | 1.376 | 1.425 |

Figure 4b

| C. Line length 14000 μm, Technology I (M3) | | | | | | | | | | | |
|---|---|---|---|---|---|---|---|---|---|---|---|
| | | Right Neighbor Phase | | | | | | | | | |
| | | 0 | 0.1 | 0.2 | 0.3 | 0.4 | 0.5 | 0.6 | 0.7 | 0.8 | 0.9 |
| Left Neighbor Phase | 0 | 1.572 | 1.551 | 1.530 | 1.502 | 1.465 | 1.419 | 1.391 | 1.429 | 1.474 | 1.521 |
| | 0.1 | 1.551 | 1.534 | 1.507 | 1.472 | 1.438 | 1.388 | 1.362 | 1.406 | 1.451 | 1.499 |
| | 0.2 | 1.530 | 1.507 | 1.474 | 1.442 | 1.400 | 1.345 | 1.323 | 1.373 | 1.423 | 1.475 |
| | 0.3 | 1.502 | 1.472 | 1.442 | 1.401 | 1.353 | 1.293 | 1.279 | 1.334 | 1.388 | 1.443 |
| | 0.4 | 1.465 | 1.438 | 1.400 | 1.353 | 1.297 | 1.241 | 1.231 | 1.288 | 1.348 | 1.406 |
| | 0.5 | 1.419 | 1.388 | 1.345 | 1.293 | 1.241 | 1.171 | 1.203 | 1.256 | 1.310 | 1.365 |
| | 0.6 | 1.391 | 1.362 | 1.323 | 1.279 | 1.231 | 1.203 | 1.206 | 1.247 | 1.291 | 1.339 |
| | 0.7 | 1.429 | 1.406 | 1.373 | 1.334 | 1.288 | 1.256 | 1.247 | 1.288 | 1.332 | 1.377 |
| | 0.8 | 1.474 | 1.451 | 1.423 | 1.388 | 1.348 | 1.310 | 1.291 | 1.332 | 1.374 | 1.424 |
| | 0.9 | 1.521 | 1.499 | 1.475 | 1.443 | 1.406 | 1.365 | 1.339 | 1.377 | 1.424 | 1.471 |

Figure 4c

| D. Line length 14000 μm, Technology II (M4) | | | | | | | | | | | |
|---|---|---|---|---|---|---|---|---|---|---|---|
| | | Right Neighbor Phase | | | | | | | | | |
| | | 0 | 0.1 | 0.2 | 0.3 | 0.4 | 0.5 | 0.6 | 0.7 | 0.8 | 0.9 |
| Left Neighbor Phase | 0 | 2.213 | 2.190 | 2.157 | 2.116 | 2.069 | 2.031 | 1.974 | 2.027 | 2.084 | 2.147 |
| | 0.1 | 2.190 | 2.161 | 2.125 | 2.081 | 2.029 | 1.982 | 1.930 | 1.991 | 2.053 | 2.119 |
| | 0.2 | 2.157 | 2.125 | 2.085 | 2.035 | 1.977 | 1.920 | 1.879 | 1.946 | 2.013 | 2.084 |
| | 0.3 | 2.116 | 2.081 | 2.035 | 1.980 | 1.913 | 1.846 | 1.818 | 1.893 | 1.965 | 2.041 |
| | 0.4 | 2.069 | 2.029 | 1.977 | 1.913 | 1.837 | 1.775 | 1.750 | 1.831 | 1.909 | 1.989 |
| | 0.5 | 2.031 | 1.982 | 1.920 | 1.846 | 1.775 | 1.666 | 1.730 | 1.804 | 1.879 | 1.955 |
| | 0.6 | 1.974 | 1.930 | 1.879 | 1.818 | 1.750 | 1.730 | 1.713 | 1.773 | 1.835 | 1.901 |
| | 0.7 | 2.027 | 1.991 | 1.946 | 1.893 | 1.831 | 1.804 | 1.773 | 1.830 | 1.892 | 1.957 |
| | 0.8 | 2.084 | 2.053 | 2.013 | 1.965 | 1.909 | 1.879 | 1.835 | 1.892 | 1.951 | 2.015 |
| | 0.9 | 2.147 | 2.119 | 2.084 | 2.041 | 1.989 | 1.955 | 1.901 | 1.957 | 2.015 | 2.079 |

Figure 4d

OPTIMIZING REPEATERS POSITIONING ALONG INTERCONNECTS

CROSS-NOTING TO PROVISIONAL APPLICATION

A claim is hereby made for the benefit under 35 U.S.C 119(e) of a U.S. provisional application serial no. 60/144,386, filed on Jul. 16, 1999, which is incorporated herein by reference.

RELATED APPLIACTIONS

This application is related to and incorporates herein by reference the following co-pending applications: U.S. patent application Ser. No. 09/276,992 titled "Interconnects Capacitive Effects Estimation," filed Mar. 26, 1999, U.S. patent application Ser. No. 09/301,836 titled "Noise Estimation For Coupled RC Interconnects in Deep Submicron Integrated Circuits," filed Apr. 29, 1999 and U.S. patent application Ser. No. 09/387,934 titled "Determining a Worst Case Switching Factor For Integrated Circuit Design," filed Sep. 1, 1999, all of which are assigned to the assignee of the present application.

FIELD OF THE INVENTION

This application relates to integrated circuit (IC) design and, specifically, to interconnects propagation delay analysis in high speed, high density IC design.

BACKGROUND OF THE INVENTION

Forming interconnections in integrated circuit (IC), semiconductor fabrication in includes metallization. The purpose of metallization in semiconductor fabrication is to interconnect the various components of the IC. Metallization involves the deposition of a layer of conductive material, generally referred to as a metal layer, over the surface of the silicon substrate and the etching of a pattern in the metal layer to form the interconnections of the desired circuit. In automated IC design, the metal layer pattern is created by routing that implements the specified circuit. A typical IC includes more than one metal layer (e.g., M1, M2, . . . , and M6), the metal layers being individually created and then connections being made between the metal layers as needed.

As semiconductor design and fabrication improves, semiconductor technology scales become smaller. Semiconductor technology roadmaps predict, for example, that the number of metal (wiring) layers may reach 10 layers even in the 130 nm process generation, and the maximum clock frequencies will reach the gigahertz range even in the 180 nm process generation. It is further predicted that the interval between process generations may be somewhat less than three years.

With current and predicted technology scaling, the design for performance, manufacturability and reliability in high density, high performance deep-submicron ICs is increasingly dependent on IC interconnections design. In order to achieve high speed operations, special attention is paid to the method of interconnecting components in the IC. For instance, routing tools are increasingly required to combine considerations of signal, power/ground and clock distribution.

Interconnections in the IC form signal paths. For high speed signals, an interconnect and its environment becomes a relatively complex circuit element along which the signals propagate with finite speed. The complex circuit element has resistive, capacitive and inductive attributes that contribute to signal propagation time delays. With such attributes, the interconnect, also known in the context of ICs as a wire, net or line, is an important IC performance limiting factor. With interconnect delays dominating overall IC signal path delays, care is taken as to the characteristics of interconnects, their routing and the performance limiting factors that are associated with the interconnects.

For instance, a reflection of signal energy which is returned along an interconnect to the signal origin point may cause ringing or a "bumpy" rising edge. To maintain the integrity of signals propagating through interconnects, the geometry (e.g., length) of interconnects is controlled relative to the rise time of signals. Additionally, interconnects configured as transmission lines are typically terminated with a resistance corresponding to the characteristic impedance of such interconnects. However, further improvement in the design of interconnects is needed in order to achieve high speed operations in high density sub-micron ICs. The present invention addresses this and related problems.

SUMMARY OF THE INVENTION

A preferred embodiment of the present invention provides an aspect of interconnect design for optimizing delay characteristics of interconnects. The preferred embodiment further provides a method for analyzing the delay characteristics of interconnects for verifying interconnect design results. Interconnect delay characteristics are improved by inserting repeaters at predetermined intervals along interconnects in a metal layer. The metal layer is any one of a plurality of metal layers in a semiconductor device that embodies an integrated circuit (IC). Typically, each interconnect in the metal layer has at least one neighboring interconnect. The position of repeaters along every other interconnect in the metal layer is shifted relative to the position of repeaters along their neighboring interconnect(s). To achieve improved interconnect delay characteristics, the positioning of repeaters along interconnects is optimized by adjusting the position shift based on factors such as repeaters physical characteristics and signal waveforms.

In accordance with the purpose of the invention, as embodied and broadly described herein, the invention relates to a method for optimizing repeaters positioning along interconnects. Specifically, the method includes inserting repeaters in positions along a first interconnect at predetermined intervals that are related to signal transition times. The method further includes inserting repeaters in positions along a second interconnect at the predetermined intervals, the second interconnect being a neighbor of the first interconnect. The positions along the second interconnect are offset, by a predetermined length, relative to the positions along the first interconnect so that the repeaters along the second interconnect are shifted relative to the repeaters along the first interconnect. The predetermined length is half (0.5) of the predetermined intervals such that repeaters are phase shifted by half, wherein the interconnect delay that corresponds to the offsetting by half of the predetermined interval minimizes the interconnect delay under worst case conditions. The repeaters are inserted to decrease interconnect delay and to make the interconnect delay scale linearly with an interconnect length.

In further accordance with the purpose of the invention, as embodied and broadly described herein, the invention relates to a second method of analyzing interconnects tuning. The method of analyzing interconnects tuning also includes providing a metal layer in a semiconductor device, wherein the metal layer is patterned to have a plurality of interconnects, and inserting repeaters at predetermined intervals along each of the plurality of interconnects, the predetermined intervals being related to signal transition times. This analyzing method further includes providing a signal having a waveform to each of the plurality of interconnects, wherein each of the signal waveforms of signals that are provided to every other interconnect of the plurality of interconnects are offset, by a predetermined phase, relative to signal waveforms that are provided to interconnects neighboring the every other interconnect. With this setup, the delay characteristics of each interconnect are analyzed for selected values of the predetermined phase. One of the selected values of the predetermined phase correlates to half (0.5) of the predetermined interval.

In further accordance with the purpose of the invention, as embodied and broadly described herein, the invention relates to a second method of analyzing interconnects tuning. The method of analyzing interconnects tuning also includes providing a metal layer in a semiconductor device, wherein the metal layer is patterned to have a plurality of interconnects, and inserting repeaters at predetermined intervals along each of the plurality of interconnects, the predetermined intervals being related to signals transition time. This analyzing method further includes providing a signal having a waveform to each of the plurality interconnects, wherein each of the signal waveforms of signals that are provided to every other interconnect of the plurality of interconnects are offset, by a predetermined phase, relative to signal waveforms that are provided to interconnects neighboring the every other interconnect. With this setup, the delay characteristics of each interconnect is analyzed for selected values of the predetermined phase. One of the selected values of the predetermined phase correlates to half (0.5) of the predetermined interval.

Advantages of the invention will be set forth, in part, in the description that follows and, in part, will be understood by those skilled in the art from the description herein. The advantages of the invention will be realized and attained by means of the elements and combinations particularly pointed out in the appended claims and equivalents.

part of this specification, illustrate several embodiments of the invention and, together with the description, serve to explain the principles of the invention.

BRIEF DESCRIPTION OF THE DRAWINGS

The accompanying drawings, which are incorporated in and constitute a part of this specification, illustrate embodiments of the invention and, together with the description, serve to explain the principles of the invention.

FIGS. 1a and 1b illustrate insertion to interconnects of repeaters in intervals. In FIG. 1b, the repeaters in adjacent interconnects are offset.

DETAILED DESCRIPTION OF A PREFERRED EMBODIMENT

The present invention provides an aspect of interconnect design for optimizing delay characteristics of interconnects. Specifically, to satisfy signal propagation delay and integrity constraints, repeaters are inserted in locations along interconnects. The relative positioning of the repeaters is optimized.

Reference will now by made in detail to a preferred embodiment of the invention, examples of which are illustrated in the accompanying drawings. Wherever convenient, the same reference numbers will be used throughout the drawings to refer to the same or like parts.

When lateral coupling capacitances are large, worst-case "Miller coupling" begins to dominate noise and delay calculations. Miller coupling is a gain-related multiplication effect that causes the multiplication of effective coupling capacitances seen by interconnects. The Miller Coupling effect increases with the frequency and thus interconnect coupling becomes increasingly detrimental at higher frequencies. When a pair of neighboring interconnects L1 and L2 switch simultaneously in opposite directions, the driver gate of L1 sees the grounded interconnect capacitance plus twice the coupling capacitance of L1 to L2. If L2 is quiet when L1 switches, then the driver gate of L1 sees the grounded interconnect capacitance plus the coupling capacitance to L2. And if L2 switches simultaneously in the same direction, the driver gate of L1 sees only the grounded interconnect capacitance. (In leading-edge processes, each neighbor coupling is of the same (and possibly greater) magnitude as the area coupling to ground.) The "coupling factor" or "switching factor" is often given in the range of [0,2], and since most interconnects have two neighbors, the total coupling factor is in the range of [0,4]. (A detailed discussion about determining the switching factor under worst-case switching conditions at coupled interconnects is provided in the above-referenced co-pending application titled: "Determining A Switching Factor For Optimized Integrated Circuit Design.")

Repeaters Position Offsetting Methodology for Global Buses

Global interconnect layers (e.g., metal layers M4–M6) support inter-component signal runs with a length on the order of 3000 um–15000 $\mu$m. Global interconnects are increasingly dominated by wide buses and are designed in light of worst-case Miller coupling. A long global bus is routed using repeater blocks, i.e., blocks of co-located repeaters (e.g., inverters) spaced in intervals, say, 4000 $\mu$m.

Figure 1A:
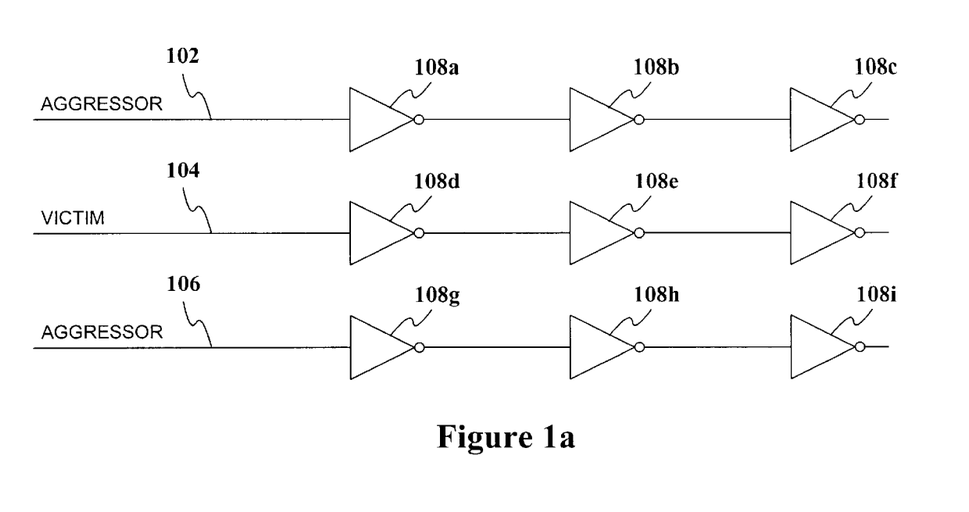
Figure 1B:
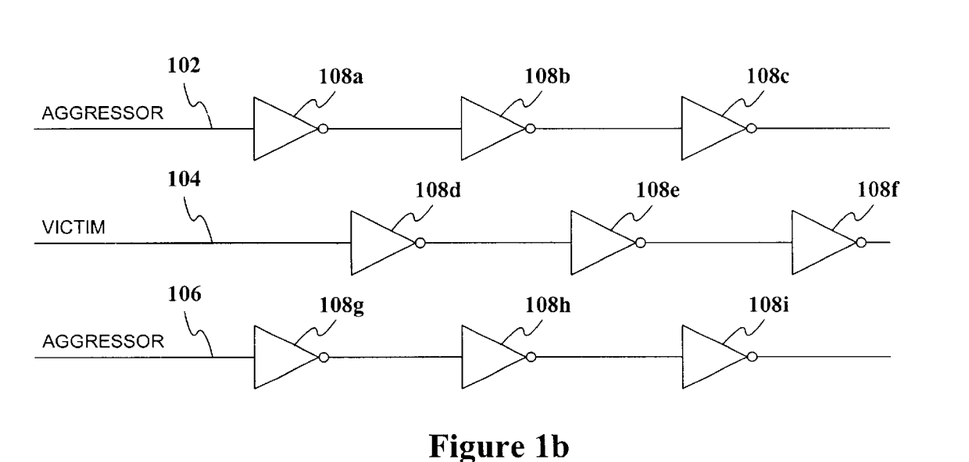

To reduce the worst-case Miller coupling, the repeaters in adjacent interconnects are offset, as shown in FIG. 1b. FIGS. 1a and 1b illustrate insertion to interconnects of repeaters (shown as inverters) in predetermined intervals. In FIG. 1a, there are three interconnects 102, 104 and 106. Each of the interconnects is assumed to be coupled to the neighbor interconnect and is affected by switching conditions at the neighbor interconnect. Interconnect 104, in the middle, is affected by the interconnects 102 and 106 on either one of its sides. Accordingly, interconnect 104 is labeled "victim" and the interconnects 102 and 106 on either one of its sides are labeled "aggressors." In FIG. 1a, the repeaters are placed along their respective interconnect without any offset between them. In other words, the repeaters along each of the aggressor interconnects 102 and 106 are placed at zero (0) phase difference relative to the respective repeaters along the victim interconnect 104.

Preferably, the repeaters are inverters or logic gates configured as inverters. A characteristic of CMOS (coupled metal oxide semiconductor) inverters is the ratio (K:1) of the positive (P) region width to negative (N) region width. For typical CMOS inverters, particularly where K=2, the preferred offset is equal to half (0.5) the interval between repeaters. In other words, a phase shift of 50% between respective repeaters along neighboring interconnects is preferred. For example, if repeaters are place along an interconnect at intervals of L$\mu$m, the offset translates to ½L. The interval, L, e.g., 4000 $\mu$m, is determined based on relative transition start and end times of signals. With a relative offset between respective repeaters of 0.5 (half) distance, the signals in neighboring interconnects switch in the opposite direction only one half of the switching cycle.

In a configuration as shown in FIG. 1a, the worst-case switching condition (i.e., signals at aggressor interconnects switching simultaneously and in the opposite direction relative to signals at the victim interconnect) persists throughout the entire chain of repeaters. This is so because of the relative placement of the repeaters (with no offset) as described above. (A detailed description of the effects of worst-case switching conditions on coupled interconnects is provided in the above-referenced co-pending application titled: "Determining A Switching Factor For Optimized Integrated Circuit Design.") Conversely, in a configuration as shown in FIG. 1b, where the phase shift of repeater locations is substantially half (translated to half of the predetermined interval), any worst-case simultaneous switching on aggressor and victim interconnects persists only for half of each switching period (distance) between consecutive repeaters. Furthermore, for the other half of the switching period (distance) the switching condition becomes best-case simultaneous switching.

To confirm the advantages of this approach, various phase shift (offset) configurations can be studied. In each case, signal propagation delay results at the aggressors and victim interconnects is then registered. The phase shifts range from 0.0 to 1.0 at 0.1 increments.

For each configuration in the study, the interconnects are modeled using metal layers M3 and M4 in a 0.25 $\mu$m CMOS process as representative technology. It is noted, however, that the principles presented herein are applicable to any metal layer (e.g., M1, M2, . . . M7). In each metal layer, there are three interconnects, a victim interconnect and on each side of the victim interconnect an aggressor interconnect. The interconnects have lengths of either 10,000 $\mu$m or 14,000 $\mu$m. Characteristic interconnect resistance in this technology is 50 $\Omega$ per 1000 $\mu$m. In layer M3, the capacitive coupling per 1000 $\mu$m from the victim interconnect to each of the aggressor interconnects is 60 $\mu$F, and to ground the capacitive coupling is 80 $\mu$F. In layer M4, the capacitive coupling per 1000 $\mu$m from the victim interconnect to each of the aggressor interconnects is 80 $\mu$F, and to ground the capacitive coupling is 160 $\mu$F.

As mentioned before, for analysis purposes the middle interconnect is considered the victim. The interval between repeaters is assumed to be 4000 $\mu$m. The repeaters along the victim (middle) interconnect are placed at zero (0.0) phase locations at intervals of 4000 $\mu$, i.e., at positions 4000 $\mu$, 8000 $\mu$, etc., along the victim interconnect. For each of the above-mentioned configurations, the repeaters along the aggressor interconnects are placed at intervals (of 4000 $\mu$) according to all the phase shift (offset) combinations 0.0, 0.1, 0.2, . . . , 0.9. That is, with a phase shift (offset) of 0.2, for example, the repeaters are placed along the aggressor interconnects at positions 4800 $\mu$, 9600 $\mu$, etc., and with a phase shift (offset) of 0.5, the repeaters are placed at positions 6000 $\mu$, 1000 $\mu$, etc. There are 100 different phase combinations.

For this study, the interconnects are stimulated by signals of a waveform with a rise-time and fall-time of 200 ps. The signal waveforms are periodic with the first transition either rising (R) or falling (F). There are eight combinations of directions for the first transitions, i.e., RRR, RRF, . . . , FFF. Additionally, the waveform cycles of the signals for each of the aggressor interconnects can be offset relative to the waveform cycle of the signal for the victim interconnect. If so, the signals are offset (delayed or accelerated), for example, by −100 ps, 0.0 ps or +100 ps. There are nine (9) combinations of these input signals offsets.

Figure 2:
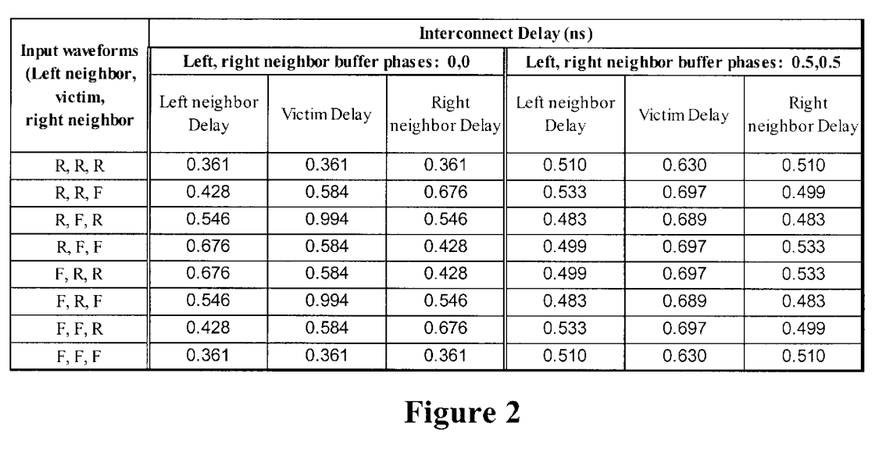
FIG. 2 shows experimental propagation delay results for all combinations of rising (R) and falling (F) initial transition of signals and phase shifts of approximately (0,0) and (0.5,0.5) of repeater locations along aggressor interconnects relative to the phase 0 (no shift) of repeater locations along a victim interconnect.
Figure 3A:
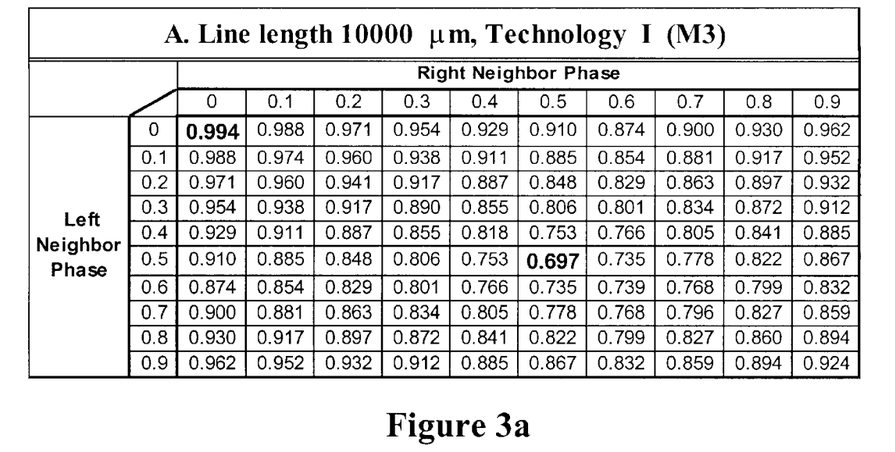
FIGS. 3a–3d show worst-case propagation delays (with respect to all eight possible combinations of rising and falling signals) for the victim interconnect, for each combination of phase shifts of repeater locations along the aggressor (left and right neighbor) interconnects.
Figure 3B:
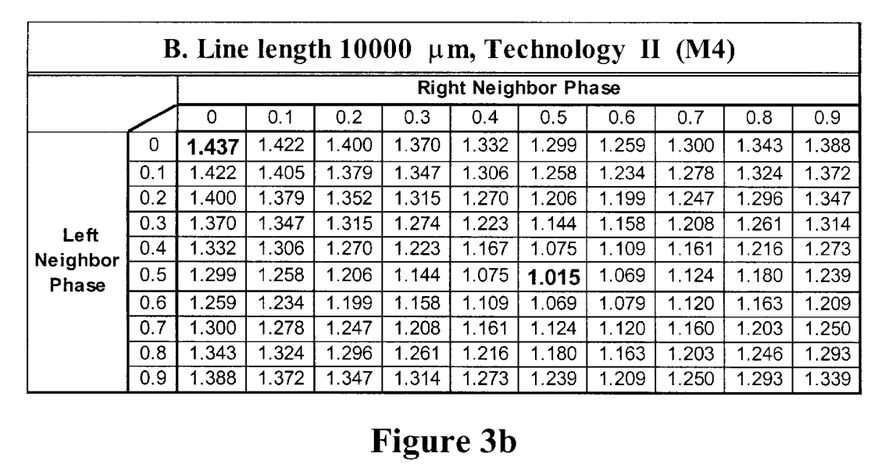
Figure 3C:
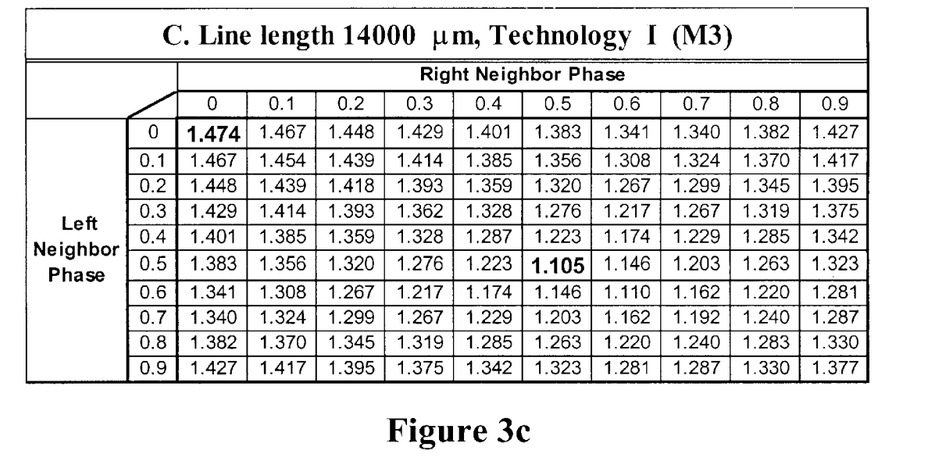
Figure 3D:
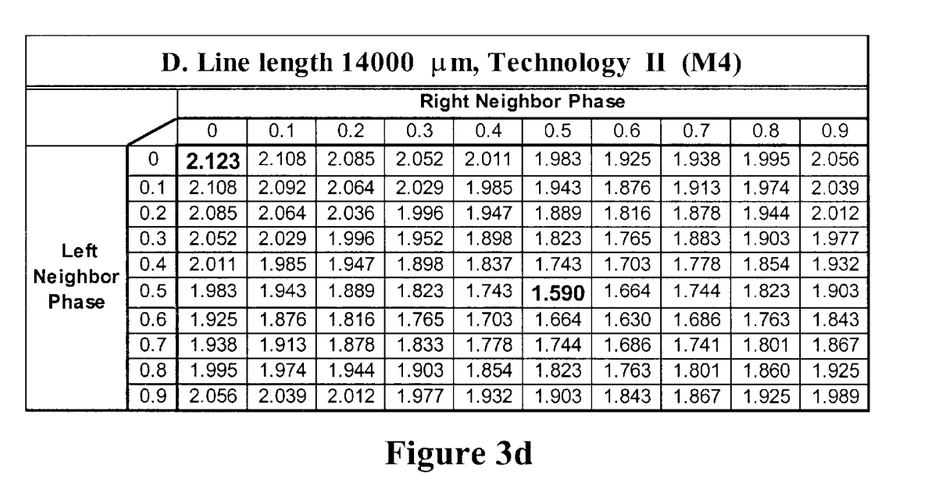
Figure 4A:
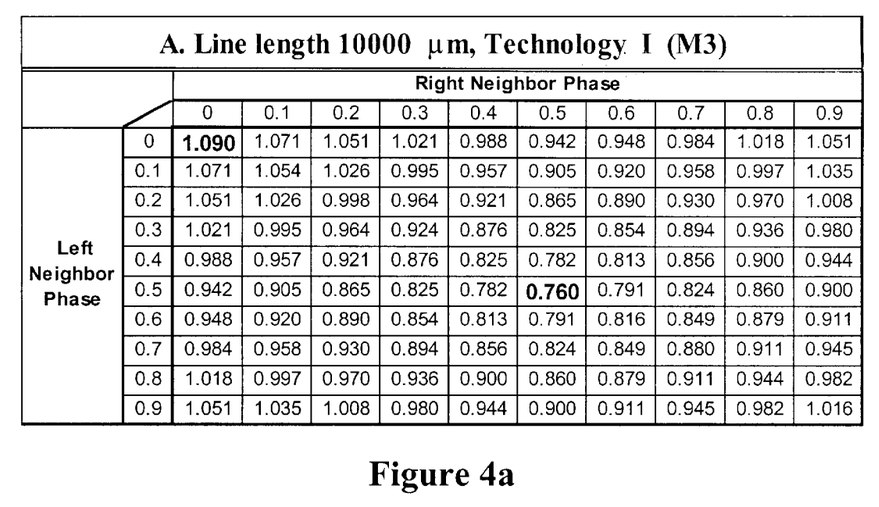
FIGS. 4a–4d show the same worst-case delay results for the victim interconnect, taken over all eight rise/fall combinations and all nine combinations of signal waveform offsets.
Figure 4B:
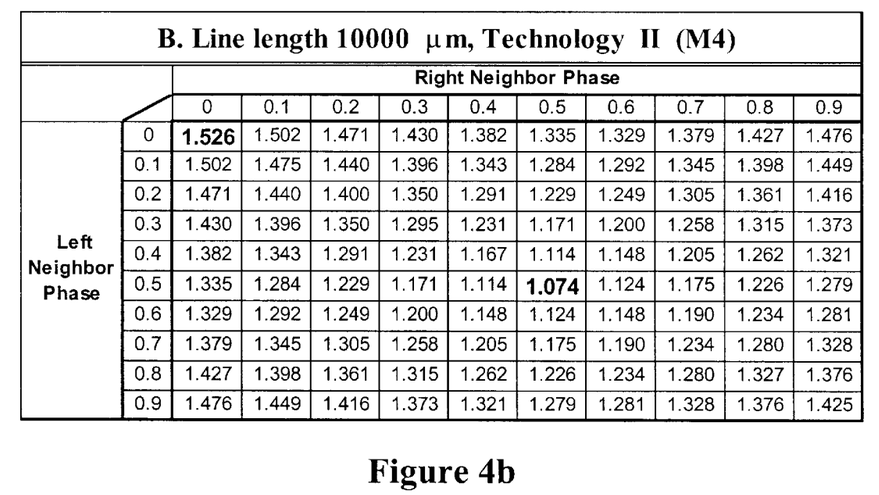
Figure 4C:
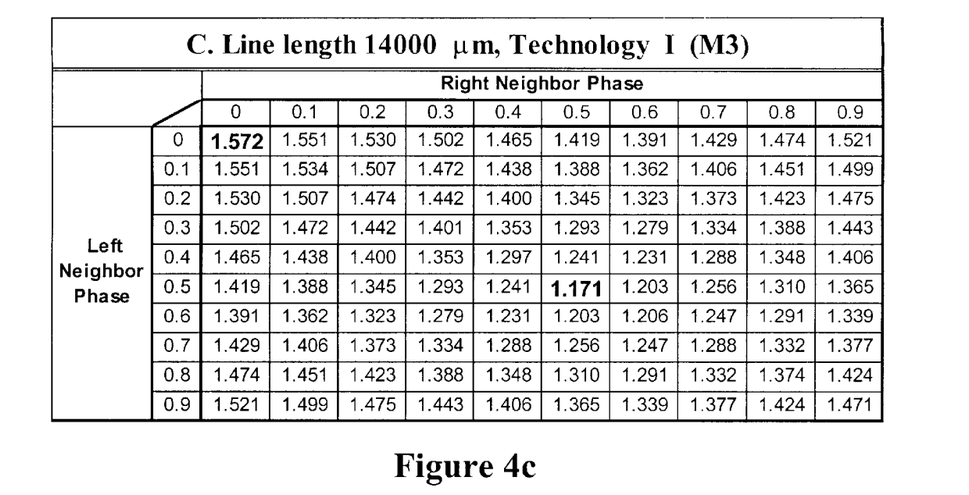
Figure 4D:
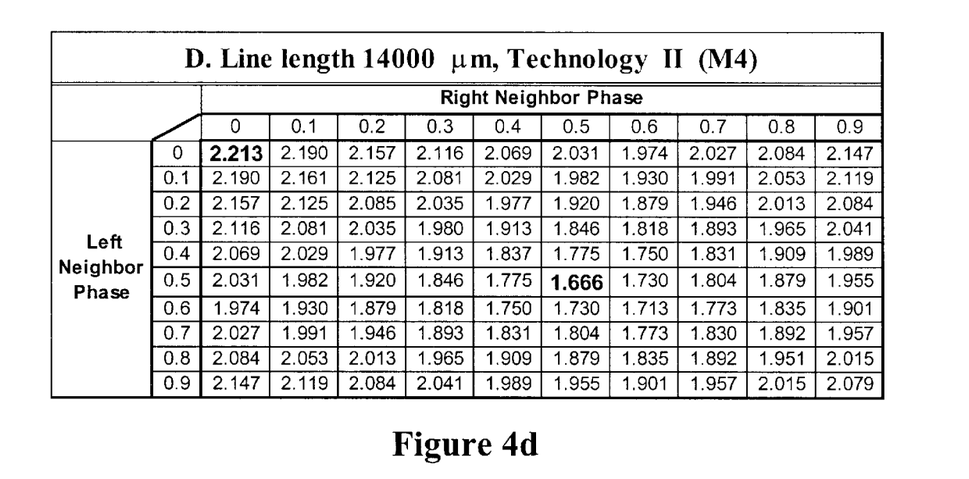

FIG. 2 shows, for an example of the above-described configurations, experimental propagation delay results for all combinations of rising (R) and falling (F) initial transition of the signals. The interconnects length in this example is 10,000 $\mu$, and the metal layer is M3. FIG. 2 shows respective propagation delay results for phase shifts of approximately (0,0) and (0.5,0.5) of repeaters along aggressor interconnects relative to the phase 0 (no shift) of repeaters along the victim interconnect. The effect of Miller coupling is clearly shown in the results.

FIGS. 3a–3d show the worst-case propagation delays (with respect to all eight possible combinations of rising and falling signals) for the victim, for each combination of phase shifts for the repeater locations along the aggressor (left and right neighbor) interconnects. Signal offsets are all 0, i.e., the waveforms cycle start at the same time. All four combinations of metal layer and line length are shown. In every case, the optimum phase shift combination is (0.5,0.5), while the phase shift combination of (0.0,0.0) is actually the least beneficial. The worstcase delay is reduced by anywhere from 25% to 30% when the repeaters are placed with the optimum 0.5 phase shift.

Finally, and in comparison to the delay results shown in FIGS. 3a–3d, FIGS. 4a–4d show the same worst-case delay results for the victim interconnect, taken over all eight rise/fall combinations and all nine combinations of signal waveform offsets (rather than repeaters location offsets). Again, even when the signal stimulating the interconnects do not switch perfectly simultaneously, the best phase combination is (0.5,0.5) and the least beneficial phase combination is (0,0).

In summary, the foregoing repeaters offset technique, particularly, the use in accordance with the preferred embodiment of the invention of 0.5 phase shift as an offset, can reduce worst-case propagation delays along interconnects by more than 30% as compared with conventional techniques. Even though the discussion elaborated on the case of shifting the repeaters by an offset of 0.5 (i.e., placing the repeaters in the middle of the interval) other offsets could be used depending, for example, on repeaters technology (e.g., relative width of P and N regions), neighboring interconnects coupling capacitance and slew time values. In any case, the principle of offsetting repeaters along an interconnect relative to repeaters along a neighbor (adjacent, parallel or the like) interconnect applies to all interconnects throughout each metal layer. It means the interconnects with non-offset repeaters (i.e., victims) are interleaved among interconnects with offset repeaters (i.e., aggressors), where two interconnects of the same kind are typically not next to each other.

Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A method of analyzing delay characteristics of interconnects, comprising:

provi ding a metal layer in a semiconductor device, the metal layer being patterned to have a plurality of interconnects;

inserting repeaters at predetermined intervals along each of the plurality of interconnects, the predetermined intervals being related to signals transition time;

providing a signal having a waveform to each of the plurality of interconnects, the signal waveforms of signals that are provided to every other interconnect of the plurality of interconnects being offset, by. a predetermined phase, relative to signal waveforms that are provided to interconnects neighboring the every other interconnect; and analyzing the delay characteristics of each interconnect for selected values of the predetermined phase.

2. The method of claim 1, wherein one of the selected values of the predetermined phase correlates to half (0.5) of the predetermined interval.

* * * * *

UNITED STATES PATENT AND TRADEMARK OFFICE
CERTIFICATE OF CORRECTION

PATENT NO. : 6,389,581 B1
DATED : May 14, 2002
INVENTOR(S) : Sudhakar Muddu et al.

It is certified that error appears in the above-identified patent and that said Letters Patent is hereby corrected as shown below:

<u>Title page,</u>
Item [73], please change the Assignee from "Silicone Graphics Inc., Mountain View, CA" to -- Silicon Graphics, Inc., Mountain View, CA --.

Signed and Sealed this

Twenty-first Day of January, 2003

JAMES E. ROGAN
*Director of the United States Patent and Trademark Office*